US006802944B2

(12) United States Patent
Ahmad et al.

(10) Patent No.: US 6,802,944 B2
(45) Date of Patent: Oct. 12, 2004

(54) HIGH DENSITY PLASMA CVD PROCESS FOR GAPFILL INTO HIGH ASPECT RATIO FEATURES

(75) Inventors: Farhan Ahmad, Singapore (SG); Michael Awdshiew, Singapore (SG); Alok Jain, Singapore (SG); Bikram Kapoor, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 3 days.

(21) Appl. No.: 10/279,961

(22) Filed: Oct. 23, 2002

(65) Prior Publication Data

US 2004/0079632 A1 Apr. 29, 2004

(51) Int. Cl.$^7$ .......................... C23C 14/34; C23F 1/00; B05D 1/00
(52) U.S. Cl. .......................... 204/192.23; 204/192.32; 204/192.37; 216/63; 216/67; 216/80; 427/331; 427/255.28; 427/578; 427/307; 427/314; 427/402; 427/534
(58) Field of Search ...................... 204/192.37, 192.32, 204/192.23; 216/63, 67, 80; 427/585, 331, 255.28, 578, 307, 314, 402, 534, 535

(56) References Cited

U.S. PATENT DOCUMENTS

| 4,690,746 A | 9/1987 | McInerney et al. ...... 210/221.2 |
| 4,872,947 A | 10/1989 | Wang et al. ................. 156/643 |
| 4,892,753 A | 1/1990 | Wang et al. .................. 427/38 |
| 4,960,488 A | 10/1990 | Law et al. .................. 156/643 |
| 5,000,113 A | 3/1991 | Wang et al. ................. 118/723 |
| 5,089,442 A | 2/1992 | Olmer ........................ 432/235 |
| 5,156,881 A | 10/1992 | Okano et al. ............... 427/572 |
| 5,271,972 A | 12/1993 | Kwok et al. ................. 427/579 |
| 5,275,977 A | 1/1994 | Otsubo et al. .............. 437/235 |
| 5,279,865 A | 1/1994 | Chebi et al. ................. 427/574 |

(List continued on next page.)

OTHER PUBLICATIONS

Meeks et al., "Modeling of SiO$_2$ deposition in high density plasma reactors and comparisons of model predictions with experimental measurements," *J. Vac. Sci. Technol. A*, 16(2):544–563 (1998).

Abraham, "Reactive Facet Tapering of Plasma Oxide For Multilevel Interconnect Applications," VMIC Conference. pp. 115–121 (1987).

Lee et al., "Dielectric Planarization Techniques For Narrow Pitch Multilevel Interconnects."VMIC Conference, pp. 85–92 (1987).

Musaka, "Single Step Gap Filling Technology fo Subhalf Micron Metal Spacings on Plasma Enhanced TEOS/O2 Chemical Vapor Deposition Systems," International Conference on Solid State Devices and Materials pp. 510–512, held in Japan, (1993)

(List continued on next page.)

*Primary Examiner*—Steven VerSteeg
(74) *Attorney, Agent, or Firm*—Townsend & Townsend & Crew

(57) ABSTRACT

A method of depositing a film on a substrate. In one embodiment, the method includes depositing a first portion of the film using a high density plasma to partially fill a gap formed between adjacent features formed on the substrate. The film deposition process is then stopped before or shortly after the entry of the gap pinches off and the film is etched to widen entry to the gap using a two step etching process that includes a first physical etch step that forms a plasma from a sputtering agent introduced into the processing chamber and biases the plasma towards the substrate and a subsequent chemical etch step that forms a plasma from a reactive etchant gas introduced into the processing chamber. After the etching sequence is complete, a second portion of the film is deposited over the first portion using a high density plasma to further fill the gap.

31 Claims, 5 Drawing Sheets

U.S. PATENT DOCUMENTS

| | | | |
|---|---|---|---|
| 5,302,233 A | 4/1994 | Kim et al. | 156/636 |
| 5,319,247 A | 6/1994 | Matsuura | 257/760 |
| 5,362,526 A | 11/1994 | Wang et al. | 427/573 |
| 5,416,048 A | 5/1995 | Blalock et al. | 437/228 |
| 5,468,342 A | 11/1995 | Nulty et al. | 156/643.1 |
| 5,571,576 A | 11/1996 | Qian et al. | 427/574 |
| 5,599,740 A | 2/1997 | Jang et al. | 437/190 |
| 5,624,582 A | 4/1997 | Cain | 438/715 |
| 5,679,606 A | 10/1997 | Wang et al. | 437/195 |
| 5,719,085 A | 2/1998 | Moon et al. | 438/424 |
| 5,850,105 A | 12/1998 | Dawson et al. | 257/758 |
| 5,858,876 A | 1/1999 | Chew | 438/695 |
| 5,872,052 A | 2/1999 | Iyer | 438/622 |
| 5,872,058 A | 2/1999 | Van Cleemput et al. | 438/692 |
| 5,913,140 A | 6/1999 | Roche et al. | 438/624 |
| 5,915,190 A | 6/1999 | Pirkle | 438/424 |
| 5,937,323 A | 8/1999 | Orczyk et al. | 438/624 |
| 5,953,635 A | 9/1999 | Andideh | 538/761 |
| 5,968,610 A | 10/1999 | Liu et al. | 427/579 |
| 5,990,000 A | 11/1999 | Hong et al. | 438/631 |
| 6,030,881 A | 2/2000 | Papasouliotis et al. | 438/424 |
| 6,037,018 A | 3/2000 | Jang et al. | 427/579 |
| 6,039,851 A | 3/2000 | Iyer | 204/192.32 |
| 6,059,643 A | 5/2000 | Hu et al. | 451/296 |
| 6,136,685 A | 10/2000 | Narwankar et al. | 438/624 |
| 6,167,834 B1 | 1/2001 | Wang et al. | 118/723 E |
| 6,170,428 B1 | 1/2001 | Redeker et al. | 118/723 R |
| 6,182,602 B1 | 2/2001 | Redeker et al. | 118/723 R |
| 6,189,483 B1 | 2/2001 | Ishikawa et al. | 118/723 E |
| 6,190,233 B1 | 2/2001 | Hong et al. | 451/2 |
| 6,191,026 B1 | 2/2001 | Rana et al. | 438/624 |
| 6,194,038 B1 | 2/2001 | Rossman | 427/569 |
| 6,197,705 B1 | 3/2001 | Vassiliev | 438/789 |
| 6,203,863 B1 | 3/2001 | Liu et al. | 427/579 |
| 6,335,288 B1 | 1/2002 | Kwan et al. | 438/694 |
| 6,395,150 B1 | 5/2002 | Van Cleemput et al. | 204/192.37 |
| 6,596,654 B1 | 7/2003 | Bayman et al. | 438/788 |

OTHER PUBLICATIONS

Qian et al., "High Density Plasma Deposition and Deep Submicron Gap Fill with Low Dielectric Constant SiOF Films," DUMIC Conference, pp. 50–56, held in California (1995).

Vassilieuv et al.,. "Trends in void–free pre–metal CVD dielectrics," *Solid State Technology*, pp. 129–136 (2001).

U.S. patent application Ser. No. 09/854,083,Tan et al., filed May. 11, 2001.

U.S. patent application Ser. No. 09/400,338, Xia., filed Sep. 21, 1999.

HIGH DENSITY PLASMA CVD PROCESS FOR GAPFILL INTO HIGH ASPECT RATIO FEATURES

BACKGROUND OF THE INVENTION

One of the primary steps in the fabrication of modern semiconductor devices is the formation of a thin film on a semiconductor substrate by chemical reaction of gases. Such a deposition process is referred to as chemical vapor deposition ("CVD"). Conventional thermal CVD processes supply reactive gases to the substrate surface where heat-induced chemical reactions take place to produce a desired film. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. These advantages are further exploited by high-density-plasma ("HDP") CVD techniques, in which a dense plasma is formed at low vacuum pressures so that the plasma species are even more reactive.

Any of these CVD techniques may used to deposit conductive or insulative films during the fabrication of integrated circuits. For applications such as the deposition of insulation films as premetal or intermetal dielectric layers in an integrated circuit or for shallow trench isolation, one important physical property of the CVD film is its ability to completely fill gaps between adjacent structures without leaving voids within the gap. This property is referred to as the film's gapfill capability. Gaps that may require filling include spaces between adjacent raised structures such as transistor gates, conductive lines, etched trenches or the like.

As semiconductor device geometries have decreased in size over the years, the ratio of the height of such gaps to their width, the so-called "aspect ratio," has dramatically increased. Gaps having a combination of a high aspect ratio and a small width present a challenge for semiconductor manufacturers to fill completely. In short, the challenge usually is to prevent the deposited film from growing in a manner that closes off the gap before it is filled. Failure to fill the gap completely results in the formation of voids in the deposited layer, which may adversely affect device operation, for example by trapping undesirable impurities.

One process that the semiconductor industry has developed to improve gapfill capability of insulation films uses a multistep deposition and etching process. Such a process is often referred to as a deposition/etch/deposition ("dep/etch/dep") process. Such dep/etch/dep processes divide the deposition of the gapfill layer into two or more steps separated by a plasma etch step. The plasma etch step etches the upper corners of the first deposited film more than the film portion deposited on the sidewall and lower portion of the gap, thereby widening the gap and enabling the subsequent deposition step to fill the gap without prematurely closing it off. Typically, dep/etch/dep processes can be used to fill higher-aspect-ratio small-width gaps than a standard deposition step for the particular chemistry would allow.

Most of the early dep/etch/dep processes known to the inventors were limited to thermal CVD and PECVD processes. HDP-CVD processes generally have superior gapfill capabilities as compared to these other types of CVD processes because HDP-CVD deposition process provide for a sputtering component to the deposition process simultaneous with film growth. For this reason, HDP-CVD techniques are sometimes referred to as simultaneous dep/etch processes.

It has been found in practice, however, that while HDP-CVD processes generally have better gapfill capabilities than similar non-HDP-CVD processes, for certain gap widths there remains a limit to the aspect ratio of gaps that can be filled. In view of this limit, semiconductor manufacturers have developed various dep/etch/dep techniques for HDP-CVD processes. All of the techniques known to the present inventors employ a single step etch process in which the material deposited in the preceding deposition step is etched using either a physical etch (i.e., anisotropic etch), a chemical etch (i.e., isotropic etch) or an etch step that simultaneously combines physical and chemical components. While a number of these processes are able to produce films having improved gapfill characteristics as compared to other CVD techniques, further improvements and/or alternative approaches are desirable. Such improved processes are particularly desirable in light of the aggressive gapfill challenges presented by integrated circuit designs employing minimum feature sizes of 0.10 microns and less.

BRIEF SUMMARY OF THE INVENTION

Embodiments of the present invention pertain to a high density plasma CVD dep/etch/dep gapfill process that employs a multistep etching technique to widen the entry to the gap being filled after the first deposition step. Embodiments of the invention have superior gapfill capabilities as compared to similar non-dep/etch/dep HDP-CVD processes.

One embodiment of the invention provides a method of depositing a dielectric film to fill a gap or trench formed between two adjacent raised features formed on the substrate. The method includes depositing a first portion of the dielectric film using a high density plasma formed from a first gaseous mixture flown into the process chamber to at least partially fill the gap. The film deposition process is then stopped before or shortly after the entry of the gap pinches off and the film is etched to widen entry to the gap using a multistep etching process that includes a first physical etch step and a subsequent chemical etch step. The physical etch step sputter etches the first portion of film by forming a plasma from a sputtering agent introduced into the processing chamber and biasing the plasma towards the substrate. After the physical etching step, the film is chemically etched by forming a plasma from a reactive etchant gas introduced into the processing chamber. After the etching sequence is complete and entry to the gap has been widened, a second portion of the film is deposited over the first portion by forming a high density plasma from a second gaseous mixture flown into the process chamber to further fill the gap.

According to another embodiment, a method of depositing a silica glass film on a substrate having a trench formed between adjacent raised surfaces of the substrate is disclosed. The method comprises transferring the substrate into a substrate processing chamber and depositing a first portion of the silica glass film over the substrate and within the trench by forming a high density plasma process that has simultaneous deposition and sputtering components from a first deposition gas comprising a silicon source and an oxygen source. Next, deposition of the silica glass film is stopped and a multistep etching process is begun. The first step of the etching process sputter etches the first portion of the film by biasing a high density plasma formed from a sputtering agent introduced into the processing chamber towards the substrate. The next step chemically etches the first portion of the film with reactive species formed from an etchant gas. After the multistep etching sequence, a second portion of the silica glass film is deposited over the substrate and within the trench by forming a high density plasma process that has simultaneous deposition and sputtering components from a second deposition gas comprising a silicon source and an oxygen source.

These and other embodiments of the invention along with many of its advantages and features are described in more detail in conjunction with the text below and attached figures.

DETAILED DESCRIPTION OF THE INVENTION

Embodiments of the invention pertain to a multistep high density plasma process for depositing dielectric material into high aspect ratio features. Embodiments of the invention permit the dielectric material to be deposited with substantially 100% gapfill at increased aspect ratios as compared to similar non-dep/etch/dep processes. For example, for gaps having a width of 0.13 microns substantially 100% gapfill is can be achieved by embodiments of the invention for aspect ratios of 6:1 and even higher. Embodiments of the invention are useful for a variety of different applications and are particularly useful for the fabrication of integrated circuits having minimum feature sizes of 0.13 microns or less.

In some embodiments of the invention, the dep/etch/dep process is performed as a continuous process without the need for separate plasma generation in each of the individual phases. The continuity of such a process results in increased process uniformity across a wafer. In particular, such continuity results in the same gas distribution for the deposition gases and for the etchant gas during their respective phases. Thus, even if this distribution includes some degree of nonuniformity, the multiple phases of the process tend to compensate. In regions of a wafer where the deposition is greater than average, the degree of etching tends to similarly be greater than average. Conversely, in regions of a wafer where the deposition is less than average, the degree of etching tends to similarly be less than average.

Figure 1:
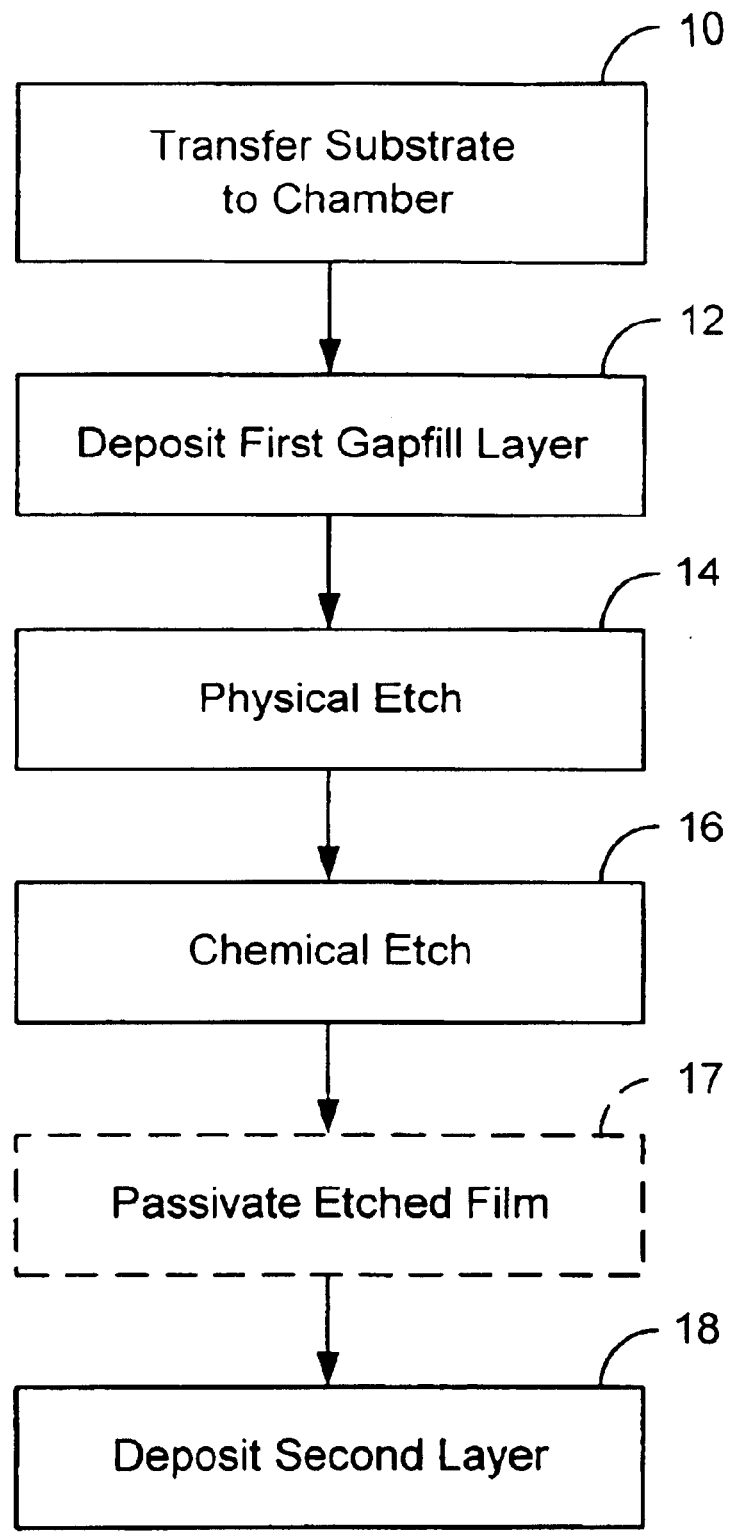
FIG. 1 is a flowchart depicting the steps associated with one embodiment of the present invention.

In order to better appreciate and understand the present invention, reference is made to FIG. 1, which is a flowchart depicting the steps associated with one embodiment of the invention, and FIGS. 2A–2E, which are simplified cross-sectional views of a substrate that illustrate the profile of film growth as the substrate is processed according to the steps depicted in FIG. 1. The process discussed below with respect to FIGS. 1 and 2A–2E is for an undoped silica glass (USG) film that may be used, for example, in a shallow trench isolation (STI) application. It is to be understood, however, that the techniques of the present invention are applicable to other applications such as intermetal dielectric (IMD) layers and premetal dielectric (PMD) among others. Also, the techniques of the present invention are applicable to the deposition of a variety of materials using HDP-CVD techniques. These materials, the use of which is application dependent, include phosphorous silica glass (PSG), boron-doped silicate glass (BSG), borophosphosilicate glass (BPGS), carbon-doped silica glass (SiOC) and silicon oxynitride among others.

Figure 2A:
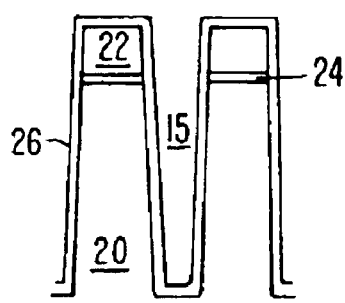
FIGS. 2A–2E are simplified cross-sectional views of a substrate that illustrate the profile of film growth as the substrate is processed according to the steps depicted in FIG. 1.

As shown in FIG. 1, the process starts by loading a substrate into a substrate processing chamber (step 10). Referring to FIG. 2A, the substrate has one or more gaps formed between adjacent raised features. The raised features may be, for example, adjacent metal lines, transistor gates or other features. In FIGS. 2A–2E, however, the raised features represent areas of a silicon substrate 20 between trenches etched in the substrate, such as trenches in a shallow trench isolation (STI) structure. The STI structure shown in FIGS. 2A–2E also includes silicon nitride portions 22 above the raised features and a silicon oxide interface or glue layer 24 between the silicon nitride portions 22 and silicon substrate 20. Also shown in FIGS. 2A–2E is an oxide liner layer 26, such as an in situ steam generation (ISSG) oxide or other thermal oxide layer. In some applications trench 15 has an aspect ratio of between about 6:1 to 8:1 and the formation of a highly conformal film such as oxide liner 26 in trench 15 may increase the aspect ratio even further to, for example 10:1 or higher.

Figure 2B:
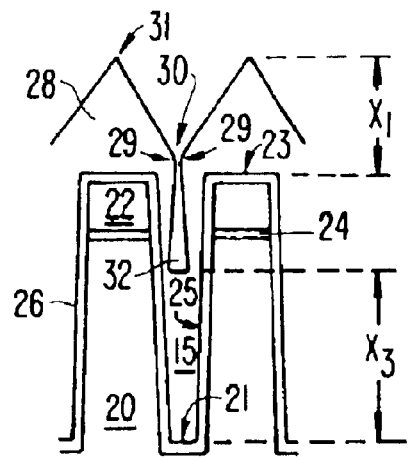

Once the substrate is properly positioned, a high density plasma is formed from a deposition gas to deposit a first layer of silica glass on the substrate using a deposition process that has simultaneous deposition and sputtering components (FIG. 1, step 12). The deposition gas includes a silicon source, such as monosilane ($SiH_4$), an oxygen source, such as molecular oxygen ($O_2$), and optionally an inert gas, such as helium (He) or argon (Ar). Referring to FIG. 2B, deposition of this first layer 28 results in a partial filling of gap 15. The profile of layer 28 within and outside of the gap will depend on the parameters used during deposition step 12 as well as the length of time of step 12.

Generally, conventional silica glass HDP-CVD deposition techniques result in direct silicon oxide deposition on the horizontal surfaces of the substrate, such as surface 21 within gap 15 and surfaces 23 above the raised portions of substrate 20 that define the gap. The deposition process also results in indirect deposition (often referred to as re-deposition) of silicon oxide on sidewalls 25 due to the recombination of material sputtered from the silicon oxide film as it grows. In certain small-width, high-aspect-ratio applications where the techniques of the present invention are most beneficial, the continued growth of the silicon oxide film results in formations 29 on the upper section gap sidewall that grow toward each other at a rate of growth exceeding the rate at which the film grows laterally on lower portions of the sidewall as shown in FIG. 2B. If deposition step 12 continues long enough, the final result of this process is a void 32 that forms within the gap when the two opposing portions of formations 29 on the upper sidewall contact each other.

Figure 2C:
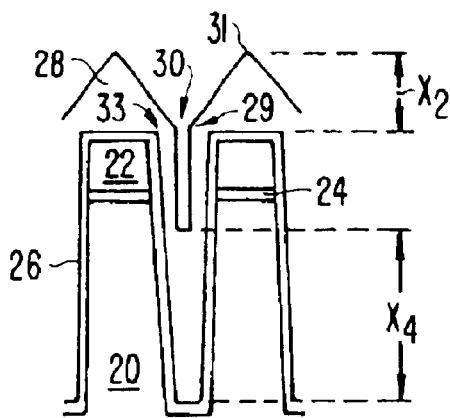
Figure 2D:
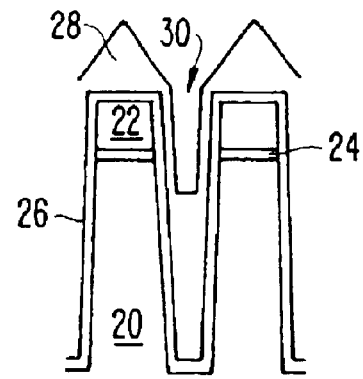
Figure 2E:
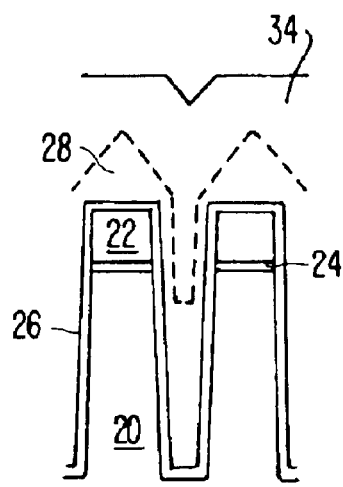

In some embodiments of the invention, the deposition of layer 28 is stopped prior to or just after formations 29 contact each other and a multi-step etching process is performed that reduces the height of the layer 28 over the raised features and widens the entry 30 to gap 15. The multi-step etch process includes a first primarily anisotropic, physical etch step (step 14) and a subsequent chemical etch step that is primarily an isotropic etch (step 16). As shown in FIGS. 2C and 2D, which illustrate substrate 20 after having undergone physical etch step 14 and chemical etch step 16, respectively, the etching process widens the entry to gap 15 thereby enabling a subsequent deposition step (FIG. 1, step 18) to deposit a second layer of material 34 over the substrate to completely fill the gap in a void-free manner as shown in FIG. 2E.

In some embodiments layer 34 is deposited using substantially the same process as layer 28 in step 12. In other embodiments, however, deposition parameters for layer 34 are adjusted to optimize the deposition-to-etch ratio (dep/etch ratio) for the aspect ratio of the remaining portion of gap 15 to be filled. In some embodiments the dep/etch ratio is between about 10–25:1 in each steps 12 and 18. When the deposition process is completed, the plasma is extinguished and the substrate is transferred out of the chamber.

Depending on how aggressive the gapfill requirement is for a particular application, a sequence of deposition/etch steps may be repeated multiple times before a final deposition step. Such a sequence of repeated etch steps may include repeating the multistep etch process of steps 14 and 16 between subsequent deposition processes or may employ a single one of steps 14 and 16 or a combined etch step that includes both physical and chemical etch components in a single step. Also, passivation step 17 may be repeated after each etch sequence and before the next deposition sequence if desired.

In one embodiment the transition to the etching step 14 is effected by stopping the flow of the silicon source gas, adjusting other gas flows as discussed further below and increasing the RF bias power applied to the substrate while maintaining the plasma from the deposition step. Similarly, transitions to other steps also maintain a plasma in the chamber while varying gas flows, chamber pressure, RF power levels and other parameters. Embodiments that maintain a plasma while transitioning to subsequent steps are performed in an in situ in a single chamber. In other embodiments, however, the plasma is extinguished between each step, gas flows and other parameters are adjusted in preparation for the next step and a plasma is reformed. Such embodiments can be in situ processes performed in a single chamber or in different chambers of a multi-chamber mainframe system or ex situ processes performed in different chambers. In some embodiments, in situ processes are preferred for throughput and performance reasons.

Referring to FIG. 2C, the sputtering component of etch step 14 etches corners of the structure, such as film peaks 31 and formations 29, at a faster rate than flat surfaces are etched. Thus, etch step 14 reduces the height of layer 28 over the raised surfaces without significantly etching the bottom of the partially filled trench 15. Thus, comparing the height of these figures in FIG. 2B to those in FIG. 2C, $x_1-x_2$ is greater than $x_3-x_4$. In some embodiments, $x_1-x_2$ is at least two and a half times $x_3-x_4$. In other embodiments $x_1-x_2$ is at least five times $x_3-x_4$ and in still other embodiments $x_1-x_2$ is at least ten times $x_3-x_4$. For example, in some embodiments $x_1-x_2=1000-1500$ Å while $x_3-x_4=0-400$ Å. Also, in some embodiments etching at the corners occurs at a rate between 3–6 times faster than etching on the flat surfaces in step 14. Etch step 14 also opens the entry to gap 30 a little bit. Etch step 16 then uses primarily isotropic etching techniques to open the entry to gap 30 further.

The sputter etching of step 14 can be achieved by accelerating ions towards the substrate during the etching process as is known to those of skill in the art. In some embodiments, sputtering is performed by biasing the substrate and introducing one or more sputtering agents such as argon, helium and/or oxygen. Other embodiments use other known sputtering agents such as neon, xenon or similar gases. A combination of oxygen and argon or another inert gas is used in one particular embodiment. In this embodiment, the addition of oxygen provides an additional sputtering component and also helps improve center-to-edge uniformity of the process. It is desirable to strictly control the sputtering process of etch step 14 so that corners 33 of the underlying features are not clipped off.

In some embodiments physical etch step 14 employs a very low pressure of, for example, between 1.0 and 4.0 mTorr, in order to reduce collisions between ions and increase their means free path thereby increasing the anisotropic nature of the etch process. Also, while the predominant etching mechanism in step 14 is vertical, anisotropic sputter etching, a relatively small isotropic component may be incorporated into step 14 to prevent sputter material from redepositing on sidewall 25 thus narrowing the trench profile. To achieve this effect, some embodiments add a flow of between about 10–100 sccm of nitrogen trifluoride ($NF_3$) or a similar etchant.

In contrast to step 14, etch step 16 is primarily an isotropic etch step that etches layer 28 equally, or almost equally, in all directions. To this end, etch step 16 employs a significantly higher flow of a reactive etchant than the reactive etchant flow used in step 14. In some embodiments, the reactive etchant flow in step 16 is at least 300 percent higher than in step 14 while in other embodiments it is at least 500 percent higher. In some specific embodiments, the reactive etchant, for example $NF_3$, is flowed into the chamber at a rate of between 300–600 sccm $NF_3$. The invention is not limited to this particular etchant, however, and contemplates using any etchant known to etch silica glass in either step 14 or step 16.

In some embodiments, a flow of oxygen is also added to step 16 in order to dilute the etchant gas and provide a more controllable etch rate. The relatively high volume of gas flowed into the chamber during etch step 16 results in a considerably higher pressure than the pressure employed in step 14. In some embodiments, chamber pressure is between about 25–100 mTorr in step 16.

The combination of separate etch steps 14 and 16 allows gaps having a particularly aggressive gapfill requirements to be completely filled in situations where a single etch step does not. For example, the inventors have found that in some situations a single, primarily physical etch step cannot widen the entry to gap 30 sufficiently for the gap to be filled in a subsequent deposition step without forming a void. Similarly, while a single, primarily chemical or purely etch step opens the entry to gap 30 relatively quickly, it also etches the bottom of the trench at essentially or approximately the same rate as other surfaces. Thus, in a pure chemical etch $x_1-x_2=x_3-x_4$ and in a primarily chemical etch $x_1-x_2 \approx x_3-x_4$. Also, the inventors have found that the multistep etch approach of the present invention to be superior to a single etch step that combines both physical and chemical etch components because including a sufficiently high flow rate of reactive etchant gas in such a single step process to adequately open gap 30, results in the bottom of the partially filled trench being etched too quickly because of the directionality imparted into the process due to the bias power component associated with a physical etch.

In embodiments where deposition step 12 is stopped shortly after formations 29 of film 28 contact each other forming a void within gap 15, etch steps 14 and 16 reopen the gap to expose the temporarily formed void while widening the entry to the gap. In embodiments where deposition step 12 is stopped prior to formations 29 forming a void, etch steps 14 and 16 widen the gap entry.

In some embodiments, the surface of the etched film is passivated (FIG. 1, step 17) prior to depositing a second portion of the gapfill material in order to remove fluorine or other halogen atoms that may be incorporated in the film due to the etching steps. In one embodiment the surface of the film is passivated by exposing the substrate to a passivation gas that is selected to chemically react with surface of the film to remove any fluorine or other halogen atoms. Suitable passivating gases include molecular oxygen ($O_2$), ozone ($O_3$), nitrous oxide ($N_2O$) and molecular nitrogen ($N_2$) in combination with any of the preceding. Further details of techniques that can be used to passivate layer 28 after an etchant step are discussed in U.S. application Ser. No. 10/138,189, filed May 3, 2002, entitled "HDP-CVD DEP/ETCH/DEP PROCESS FOR IMPROVED DEPOSITION INTO HIGH ASPECT RATIO FEATURES," and having Dongqing Li, et al. listed as coinventors which is hereby incorporated by reference in its entirety.

Embodiments of the present invention can be implemented using a variety of high density plasma CVD substrate processing chambers including chambers in which a plasma is formed by the application of RF energy to a coil that at least partially surrounds a portion of the chamber and chambers that use ECR plasma formation techniques. An example of an inductively-coupled HDP-CVD chamber in which embodiments of the method of the present invention can be practiced is set forth below.

Figure 3A:
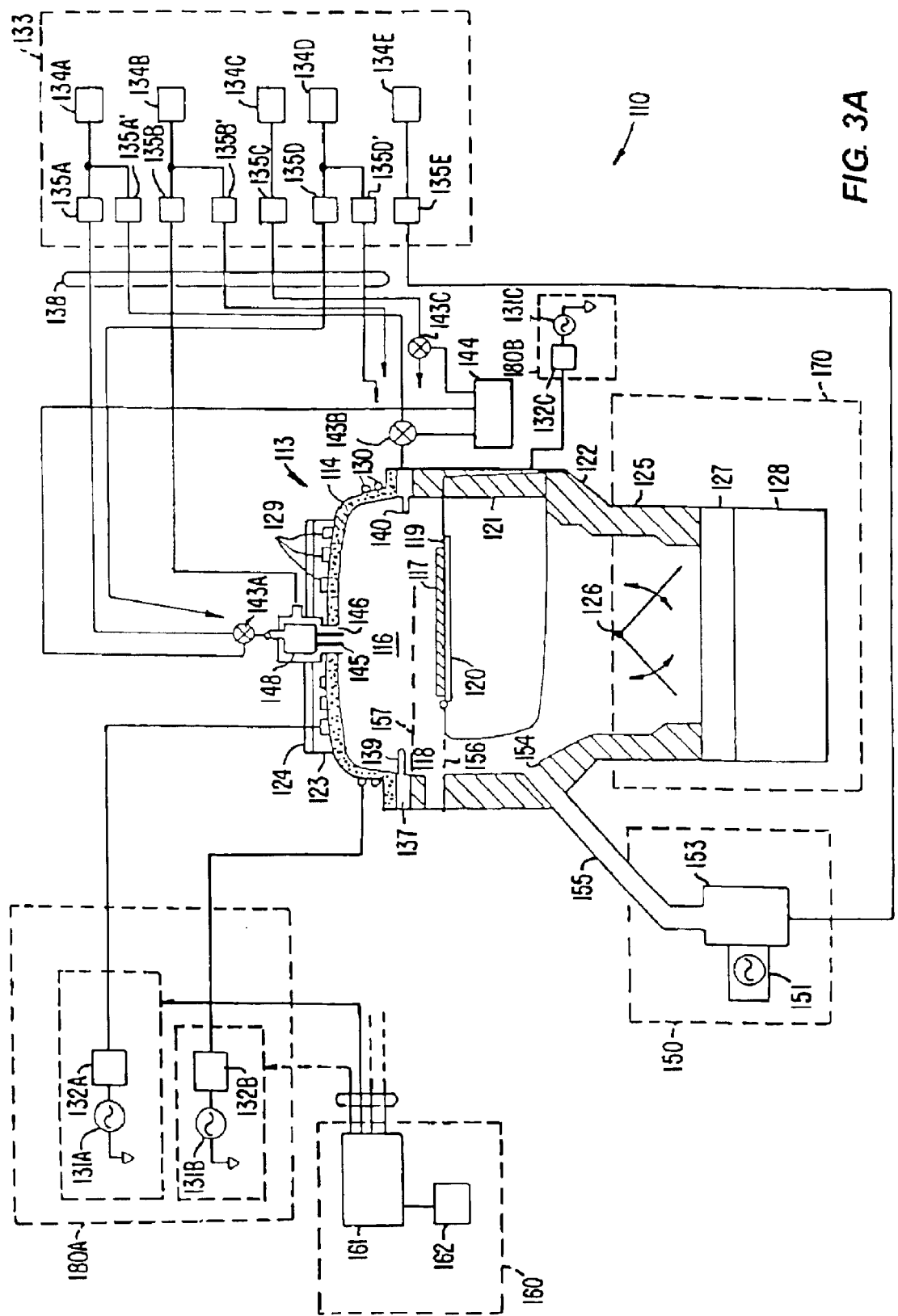
FIG. 3A is a simplified, cross-sectional view of an exemplary substrate processing system with which embodiments of the present invention may be used.

FIG. 3A illustrates one embodiment of a high density plasma chemical vapor deposition (HDP-CVD) system 110 in which a gapfill dielectric layer according to the present invention can be deposited. System 110 includes a chamber 113, a substrate support 118, a gas delivery system 133, a remote plasma cleaning system 150, a vacuum system 170, a source plasma system 180A, a bias plasma system 180B.

The upper portion of chamber 113 includes a dome 114, which is made of a ceramic dielectric material, such as aluminum oxide or aluminum nitride. Dome 114 defines an upper boundary of a plasma processing region 116. Plasma processing region 116 is bounded on the bottom by the upper surface of a substrate 117 and a substrate support 118, which is also made from an aluminum oxide or aluminum ceramic material.

A heater plate 123 and a cold plate 124 surmount, and are thermally coupled to, dome 114. Heater plate 123 and cold plate 124 allow control of the dome temperature to within about ±10° C. over a range of about 100° C. to 200° C. Generally, exposure to the plasma heats a substrate positioned on substrate support 118. Substrate support 118 includes inner and outer passages (not shown) that can deliver a heat transfer gas (sometimes referred to as a backside cooling gas) to the backside of the substrate.

The lower portion of chamber 113 includes a body member 122, which joins the chamber to the vacuum system. A base portion 121 of substrate support 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support 118. Substrate receiving portion 119 includes an electrostatic chuck 120 that can be used to secure the substrate to substrate support 118 during substrate processing.

Vacuum system 170 includes throttle body 125, which houses twin-blade throttle valve 126 and is attached to gate valve 127 and turbo-molecular pump 128. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures as low as about 1 mTorr.

Source plasma system 180A is coupled to a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. In a specific embodiment, the top source RF generator 131A provides up to 2,500 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 180B includes a bias RF (BRF) generator 131C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. Matching networks 132A and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

A gas delivery system 133 provides gases from several sources 134A . . . 134E via gas delivery lines 138 (only some of which are shown). In the particular example illustrated below, gas sources 134A . . . 134E include separate sources for $SiH_4$, $O_2$, Ar and $NF_3$ as well as one or more sources for the extended cleaning process. As would be understood by a person of skill in the art, the actual sources used for sources 134A . . . 134E and the actual connection of delivery lines 138 to chamber 113 varies depending on the deposition and cleaning processes executed within chamber 113. Gas flow from each source 134A . . . 134E is controlled by one or more mass flow controllers 135A . . . 135E and 135A . . . 135D as is known to those of skill in the art.

Figure 3B:
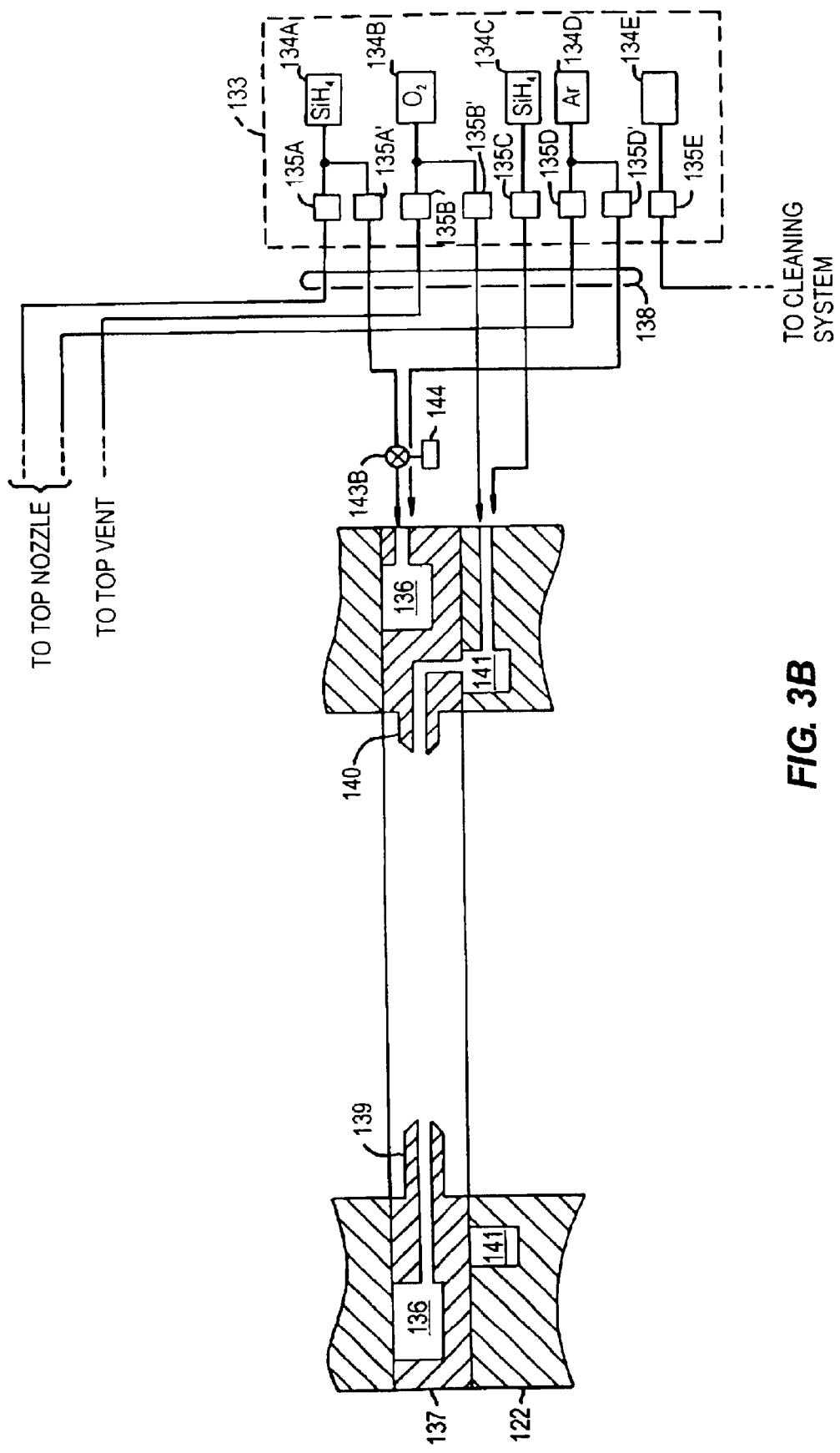
FIG. 3B is a simplified cross-sectional view of a gas ring that may be used in conjunction with the exemplary CVD processing chamber of FIG. 3A.

Gases are introduced into chamber 113 through a gas ring 137 and/or a top nozzle 145. FIG. 3B is a simplified, partial cross-sectional view of chamber 113 showing additional details of gas ring 137. In some embodiments, one or more gas sources provide gas to ring plenum 136 in gas ring 137 via gas delivery lines 138 (only some of which are shown). Gas ring 137 has a plurality of gas nozzles 139 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one specific embodiment, gas ring 137 has 124 gas nozzles 139 made from an aluminum oxide ceramic.

Gas ring 137 also has a plurality of gas nozzles 140 (only one of which is shown), which in a specific embodiment are co-planar with and shorter than source gas nozzles 139, and in one embodiment receive gas from body plenum 141. Gas nozzles 139 and 140 are not fluidly coupled in some embodiments where it is desirable to not mix gases (e.g., $SiH_4$ and $O_2$) introduced through gas ring 137 before injecting the gases into chamber 113. In other embodiments, gases may be mixed prior to injecting the gases into chamber 113 by providing apertures (not shown) between body plenum 141 and gas ring plenum 136. Additional valves, such as 143B (other valves not shown), may shut off gas from the flow controllers to the chamber.

In embodiments where flammable, toxic, or corrosive gases are used, it may be desirable to eliminate gas remaining in the gas delivery lines after a deposition or cleaning process. This may be accomplished using a 3-way valve, such as valve 143B, to isolate chamber 113 from a delivery line 138 and to vent delivery line 138 to vacuum foreline 144, for example. As shown in FIG. 3A, other similar valves, such as 143A and 143C, may be incorporated on other gas delivery lines. Such 3-way valves may be placed as close to chamber 113 and remote plasma source 150 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 3A, chamber 113 also has top nozzle 145 and top vent 146. Top nozzle 145 and top vent 146 allow independent control of top and side flows of the gases, which improves film uniformity and allows fine adjustment of the film's deposition and doping parameters. Top vent 146 is an annular opening around top nozzle 145. In one embodiment, one source, e.g., $SiH_4$, supplies source gas nozzles 139 and top nozzle 145 through separate MFCs (not shown). Similarly, separate MFCs may be used to control the flow of oxygen to both top vent 146 and gas nozzles 140 from a single source of oxygen. The gases supplied to top nozzle 145 and top vent 146 may be kept separate prior to flowing the gases into chamber 113, or the gases may be mixed in top plenum 148 before they flow into chamber 113. In other embodiments, separate sources of the same gas may be used to supply various portions of the chamber.

A remote plasma cleaning system 150, such as a microwave plasma source or torodial plasma source, is provided to periodically clean deposition residues from chamber components in a dry cleaning operation. The cleaning system includes a remote plasma generator 151 that creates a plasma from one or more cleaning gas source in sources 134A . . . 134E (e.g., molecular fluorine, nitrogen trifluoride, other fluorocarbons or equivalents alone or in combination with another gas such as Argon) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

System controller 160 controls the operation of system 110. Controller 160 may include, for example, a memory 162, such as a hard disk drive and/or a floppy disk drive and a card rack coupled to a processor 161. The card rack may contain a single-board computer (SBC), analog and digital input/output boards, interface boards and stepper motor controller boards. System controller 160 operates under the control of a computer program stored on the hard disk drive or through other computer programs, such as programs stored on a removable disk. The computer program dictates, for example, the timing, mixture of gases, RF power levels and other parameters of a particular process.

Figure 4:
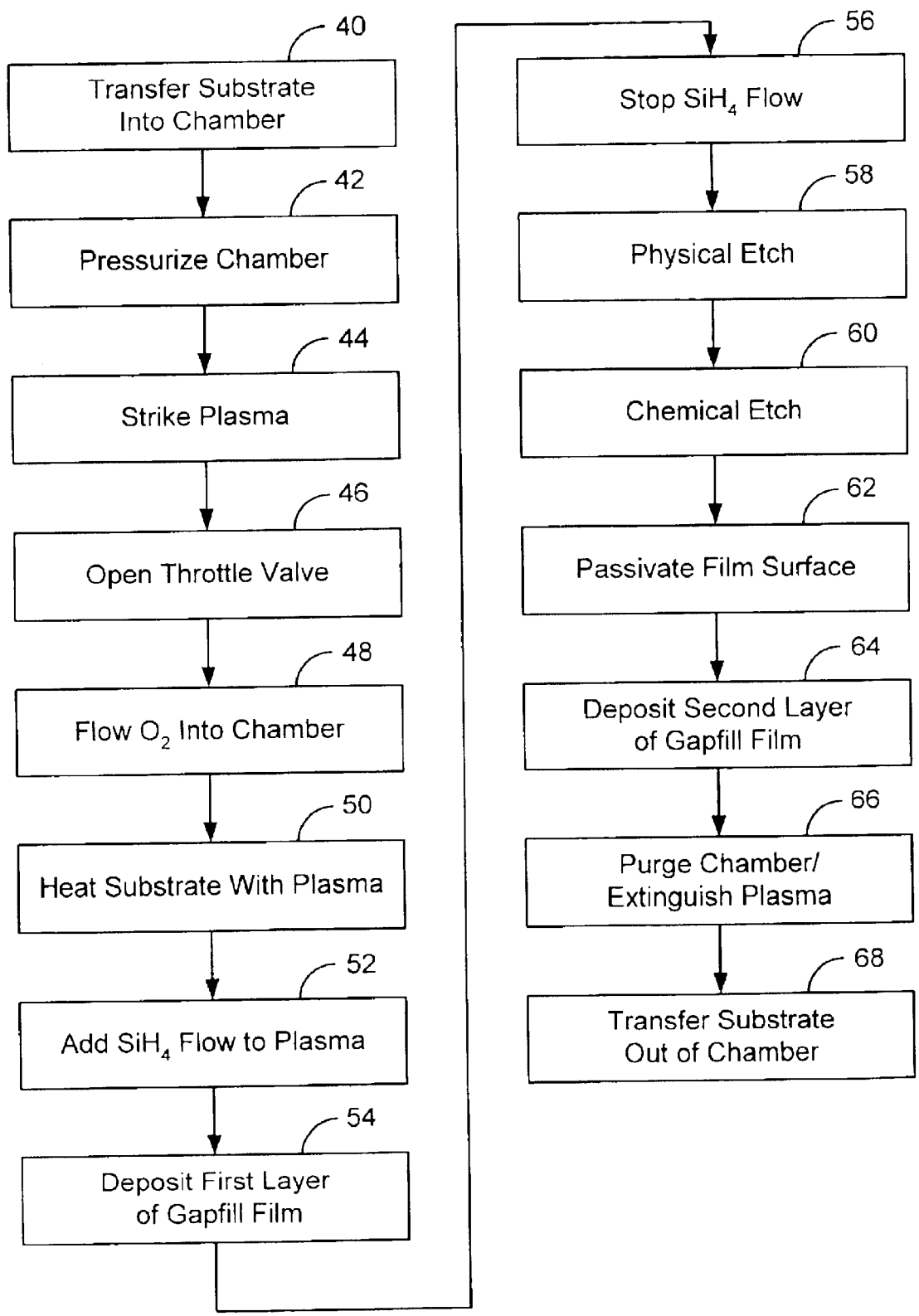
FIG. 4 is a flowchart depicting the steps associated with another embodiment of the present invention.

FIG. 4 is a flowchart depicting the steps associated with deposition of a silica glass film according to one specific embodiment of the present invention implemented in the exemplary chamber described with respect to FIGS. 3A–3B. The process depicted in FIG. 4 begins by transferring a substrate into substrate processing chamber 113 (step 40). Next, argon is flowed into the chamber with the throttle valve 126 in a closed position in order to pressurize the chamber in preparation for striking a plasma (step 42). Once the pressure has reached a sufficient level, a plasma is formed by applying RF power to top coil 129 (step 44), the throttle valve is partially opened and RF power is applied to side coil 130 (step 46).

A flow of oxygen gas is then added to the argon flow and the throttle valve is fully opened so that chamber pressure is set entirely by the rate at which gases are introduced into the chamber (step 48). Next, the plasma is maintained with flows of oxygen and argon in order to heat the substrate prior to initiating deposition of the silica glass layer (step 50). In some embodiments, heating step 50 heats the substrate to a temperature of at least 400° C. and, in some other embodiments, above 500° C. Typically heating step 50 uses source RF power only (no bias RF power) in order to ensure the underlying substrate features are not sputtered. Also, in some embodiments the substrate is not chucked to substrate support 113 during heating step 50.

Once the substrate reaches a sufficient temperature, the substrate is chucked to substrate support 118 and a flow of silane is added to the oxygen and argon flows to initiate the silica glass deposition process (step 52). The argon flow is then stopped, the flow rates of the silane and oxygen are increased to levels optimized for gapfill capabilities during the deposition of the first portion 28 of the silica glass film and bias power is applied to the pedestal (step 54). Some embodiments of the invention exclude a flow of argon from the deposition gas during step 52 in order to minimize sidewall redeposition that results in closing of the gap as discussed above with respect to FIG. 2B. Other embodiments of the invention add a flow of hydrogen and/or helium to the process gas in order to further improve gapfill capabilities as described in U.S. patent application Ser. No. 09/854,406, filed May 11, 2001, entitled "Hydrogen Assisted Undoped Silicon Oxide Deposition Process For HDP-CVD," having Zhengquan Tan et al. listed as coinventors; and U.S. patent application Ser. No. 10/137,132, filed Apr. 30, 2002, entitled "Method for High Aspect Ratio HDP CVD Gapfill," having Zhong Qiang Hua et al. listed as coinventors and are incorporated herein by reference in their entirety.

Deposition of first portion 28 of the silica glass layer is stopped after a predetermined time by stopping the flow of the silane source and switching the bias power OFF (step 56). Oxygen flow is increased slightly in step 56 in order to compensate for the stoppage of the silane source and prevent the plasma from being extinguished. In some embodiments the substrate temperature reaches levels above 550° C. during the deposition of the silica glass layer. Accordingly, some embodiments maintain an unbiased, oxygen only plasma during step 56 for between 5–20 seconds in order to allow the temperature of the substrate to cool to a temperature less than 550° C. and preferably between 350 and 500° C. Allowing the substrate to cool between deposition and etch steps enables layer 28 to be etched in a more controllable fashion.

Next, the RF bias power is switched back ON and flows of argon and $NF_3$ are introduced along with the oxygen to initiate the first physical etch step of the multistep etch process according to the invention (step 58). As explained above, a relatively small flow of $NF_3$ is added to the process in order to prevent material sputtered away by oxygen and argon ions from redepositing on the sidewalls of the trench. Also, the addition of oxygen to the process improves etch uniformity as well as providing additional sputtering.

After the completion of physical etch step 58, the flow of argon is stopped, bias power is turned OFF and the flow of $NF_3$ is increased as part of a chemical etch step (step 60). Chamber pressure is also increased during the chemical etch step to enable a higher etch rate. While the inclusion of oxygen along with the reactive etchant gas in step 60 is optional, it provides a number of advantages including reducing the etch rate of the process to a more controllable rate, reducing the number of particles generated during the etch process and subsequent deposition process and also improving the uniformity of the etch process so that fewer silicon-rich pockets (etch defects) are formed on the surface of the etched substrate. Some embodiments of the invention introduce a hydrogen source, such as $H_2$, into the etchant gas in step 60 in order to improve the etch selectivity of the process to silicon nitride and/or silicon.

As described above with respect to FIG. 1 and FIGS. 2B through 2D, etch steps 58 and 60 widen the entry 30 to gap 15 while reducing the height of material deposited over the surfaces surrounding the gap thereby enabling the gap to be filled in one or more subsequent deposition steps.

The embodiment shown in FIG. 4 transitions from etch step 60 to a subsequent deposition step by increasing the RF power levels applied to top and side coils 129 and 130, respectively, and reducing the flow rates of $NF_3$ and oxygen. Then, the flow of $NF_3$ is stopped altogether and RF bias power is applied to bombard the surface of the substrate with an oxygen-only plasma (step 62) to reduce the amount of fluorine incorporated into the gapfill layer at the interface of the layers formed before and after the etch step as well as to reduce the number of silicon-rich pockets formed.

After the passivation step is completed, RF power levels for the top and side coils as well are increased, the bias power level is increased, the flow rate of oxygen is reduced and silane and argon are introduced into the chamber to deposit top portion 34 of the silica glass layer over the substrate (step 64). After top portion 34 is deposited, the flows of silane and argon are stopped, the chamber is purged, the plasma is extinguished and the substrate is dechucked (step 66) prior to transferring the substrate out of the chamber altogether (step 68).

Depending on the height of gap to be filled as well as the width of the gap and its profile (e.g., whether or not it has a reentrant profile), additional etch and deposition sequences similar to the step 58, 60 and 64 sequence may be repeated one or more times as necessary prior to depositing the top portion 34 of the silica glass layer.

Table 1 below lists the process parameters according to an embodiment of the present invention implemented in the Ultima HDP-CVD chamber manufactured for Applied Materials and outfitted for 200 mm substrates. The gas flow rates and other parameters set forth in Table 1 below are optimized for a deposition process run in the Ultima chamber. A person of ordinary skill in the art will recognize that these rates and parameters are in part chamber specific and will vary if chambers of other design and/or volume are employed.

TABLE 1

EXEMPLARY RANGES FOR PROCESS PARAMETERS

| Parameter | Dep 1 (Step 54) | Physical Etch (Step 58) | Chemical Etch (Step 60) | Dep 2 (Step 64) |
|---|---|---|---|---|
| Top RF Power (1.8 MHz) | 3000–5100 W | 500–5000 W | 500–2000 W | 3000–5100 W |
| Side RF Power (2.1 MHz) | 3000–4800 W | 1500–5000 W | 500–2000 W | 3000–4800 W |
| Bias RF Power (13.56 MHz) | 600–4000 W | 100–3000 W | 0 W | 600–4000 W |
| $SiH_4$ Flow | 20–160 sccm | — | — | 20–160 sccm |
| $O_2$ Flow | (1.4–2.2) × $SiH_4$ Flow | 0–400 sccm | 100–400 sccm | (1.4–2.2) × $SiH_4$ flow |
| Ar Flow | 0–160 sccm | 50–160 sccm | 0–20 sccm | 0–160 sccm |
| $NF_3$ Flow | — | 10–150 sccm | 300–600 sccm | — |
| Pressure | 1.5–6.0 mTorr | 1.0–4.0 mTorr | 25–100 mTorr | 1.5–6.0 mTorr |

Having fully described several embodiments of the present invention, many other equivalents or alternative embodiments of the present invention will be apparent to those skilled in the art. For example, while the invention described with respect to an undoped silicate glass layer, the invention can also be used to improve the gapfill capabilities of phosphosilicate glass (PSG), boron-doped silicate glass (BSG), boron phosphosilicate glass (BPGS) layers and fluorine-doped silicon glass (FSG) as well as other types of materials by adding an appropriate dopant gas such as $PH_3$ for PSG, $B_2H_6$ for BSG or $SiF_4$ for FSG in one or more of the film deposition steps. Also, in other embodiments, an oxygen source such as $N_2O$ or $CO_2$ can be used instead of $O_2$ and a silicon source other than monosilane may be used. Examples of suitable silicon sources include other silane family members such as, $Si_2H_6$, $Si_3H_8$, etc.; TEOS or $SiF_4$ among others.

In still other embodiments, chemical etch step 16 can be performed by introducing remotely dissociated etchant atoms into the chamber. For example, in one embodiment, a fluorine etchant gas can be flowed into remote plasma system 150 and remotely dissociated fluorine atoms formed within system 150 can be transported to the HDP-CVD chamber to perform etch step 16. Also, while some embodiments of the invention switch bias power off during step 16, other embodiments may contemplate applying a relatively small amount of bias power (e.g., 25 percent or less of the bias power applied in step 14) to the substrate during the chemical etch step. As such, the above description is illustrative and not restrictive. These equivalents and/or alternatives are intended to be included within the scope of the present invention.

What is claimed is:

1. A method of depositing a film on a substrate disposed in a substrate processing chamber, the method comprising:
   depositing a first portion of the film over the substrate by forming a high density plasma from a first gaseous mixture flown into the process chamber;
   thereafter, sputter etching part of the deposited first portion of the film by forming a plasma from a sputtering agent introduced into the processing chamber and biasing the plasma towards the substrate;
   thereafter, chemically etching part of the deposited first portion of the film by forming a plasma from a reactive etchant gas introduced into the processing chamber; and
   thereafter, depositing a second portion of the film over the first portion by forming a high density plasma from a second gaseous mixture flown into the process chamber.

2. The method of claim 1 wherein the bias power is switched OFF during the chemical etching step.

3. The method of claim 1 wherein the first and second gaseous mixtures are silica glass deposition gases.

4. The method of claim 3 wherein the first and second gaseous mixtures each comprise silane and oxygen.

5. The method of claim 1 wherein the sputter etching includes a flow of a reactive etchant gas that is less than a flow of the reactive etchant gas in the chemical etch.

6. The method of claim 5 wherein the reactive etchant flowed into the chamber in the sputter etch and chemical etch is the same gas and wherein the flow rate of the reactive etchant is at least 300 percent higher in the chemical etch than in the sputter etch.

7. The method of claim 6 wherein the flow rate of the reactive etchant is at least 500 percent higher in the chemical etch than in the sputter etch.

8. The method of claim 6 wherein the reactive etchant is a fluorine-containing gas.

9. The method of claim 6 wherein the sputter etch and chemical etch each include a flow of an oxygen-containing gas.

10. A method of depositing a silica glass film on a substrate disposed in a substrate processing chamber, the substrate having a trench formed between adjacent raised surfaces, the method comprising, in order:
    depositing a first portion of the silica glass film over the substrate and within the trench by forming a high density plasma process that has simultaneous deposition and sputtering components from a first deposition gas comprising a silicon source and an oxygen source;
    stopping deposition of the silica glass film and sputter etching the first portion of the film by biasing a high density plasma formed from a sputtering agent introduced into the processing chamber towards the substrate;
    thereafter, chemically etching the first portion of the film with reactive species formed from an etchant gas; and
    thereafter, depositing a second portion of the silica glass film over the substrate and within the trench by forming a high density plasma process that has simultaneous deposition and sputtering components from a second deposition gas comprising a silicon source and an oxygen source.

11. The method of claim 10 wherein the high density plasma is continuously maintained between depositing a first position of the silica glass film and the sputter etching.

12. The method of claim 11 wherein the reactive species in the chemically etching the first portion of the film are dissociated remotely from a fluorine etchant gas and transported into the chamber.

13. The method of claim 11 wherein the reactive species in the chemically etching the first portion of the film are generated within the chamber by a high density plasma.

14. The method of claim 13 wherein the high density plasma is continuously maintained between depositing a first portion of the silica glass film and depositing a second portion of the silica glass film.

15. The method of claim 14 wherein the reactive etchant flowed into the chamber in the sputter etch and chemical etch is the same gas and wherein the flow rate of the reactive etchant is at least 300 percent higher in the chemical etch than in the sputter etch.

16. The method of claim 15 wherein the sputter etch and chemical etch each include a flow of an oxygen-containing gas.

17. The method of claim 16 further comprising, after chemically etching the first portion of the film, exposing the first portion of the film to a passivation gas consisting of an oxygen source with or without an inert gas.

18. The method of claim 16 wherein the trench is part of a shallow trench isolation structure formed on a silicon substrate.

19. The method of claim 16 wherein the silicon source in the first and second deposition gases comprises monosilane ($SiH_4$).

20. The method of claim 19 wherein the oxygen source in the first and second deposition gases comprises molecular oxygen ($O_2$).

21. The method of claim 20 wherein the first and second deposition gases each further comprise an inert gas as a sputtering component.

22. The method of claim 16 wherein the plasma is not biased towards the substrate while chemically etching the first portion of the film.

23. The method of claim 10 wherein the sputter etching etches at least two and a half times more of the silica glass film over the raised surfaces than at a bottom of the trench.

24. The method of claim 10 wherein the sputter etching etches at least five times more of the silica glass film over the raised surfaces than at a bottom of the trench.

25. The method of claim 10 wherein the sputter etching etches at least ten times more of the silica glass film over the raised surfaces than at a bottom of the trench.

26. A method of depositing a silica glass film on a substrate disposed in a substrate processing chamber, the substrate having a trench formed between adjacent raised surfaces, the method comprising:

forming a high density plasma within the substrate processing chamber to heat the substrate to a temperature of at least 400° C. prior to depositing the silica glass film on the substrate;

maintaining the high density plasma while (i) flowing a first process gas comprising a silicon source and an oxygen source into the processing chamber to deposit a first portion of the silica glass film over the substrate and in the trench using a deposition process that has simultaneous deposition and sputtering components, (ii) flowing a sputtering gas comprising an inert gas, an oxygen source and a fluorine etchant into the process chamber while biasing the plasma towards the substrate to sputter etch the first portion of the silica glass film; (iii) switching off bias power that biases the plasma towards the substrate and flowing a fluorine etchant and oxygen source into the chamber in order to chemically etch the first portion of the silica glass film, wherein a flow rate of the fluorine etchant is at least 300 percent higher than a flow rate of the fluorine etchant in the sputter etch; and (iv) flowing a second process gas comprising a silicon source and an oxygen source into the processing chamber to deposit a second portion of the silica glass film over the first portion using a deposition process that has simultaneous deposition and sputtering components.

27. The method of claim 26 wherein the sputter etch and chemical etch each include a flow of an oxygen-containing gas.

28. The method of claim 27 wherein the trench is part of a shallow trench isolation structure formed on a silicon substrate.

29. The method of claim 26 wherein the sputter etching etches at least two and a half times more of the silica glass film over the raised surfaces than at a bottom of the trench.

30. The method of claim 26 wherein the sputter etching etches at least five times more of the silica glass film over the raised surfaces than at a bottom of the trench.

31. The method of claim 26 wherein the sputter etching etches at least ten times more of the silica glass film over the raised surfaces than at a bottom of the trench.

* * * * *